US012609274B2

(12) United States Patent
Shouji et al.

(10) Patent No.: US 12,609,274 B2
(45) Date of Patent: Apr. 21, 2026

(54) CHARGED PARTICLE BEAM DEVICE

(71) Applicant: Hitachi High-Tech Corporation, Tokyo (JP)

(72) Inventors: Minami Shouji, Tokyo (JP); Yasuhiro Shirasaki, Tokyo (JP); Natsuki Tsuno, Tokyo (JP); Hirohiko Kitsuki, Tokyo (JP); Hiroya Ohta, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 576 days.

(21) Appl. No.: 18/019,347

(22) PCT Filed: Sep. 28, 2020

(86) PCT No.: PCT/JP2020/036728
    § 371 (c)(1),
    (2) Date: Feb. 2, 2023

(87) PCT Pub. No.: WO2022/064719
    PCT Pub. Date: Mar. 31, 2022

(65) Prior Publication Data
    US 2023/0274909 A1     Aug. 31, 2023

(51) Int. Cl.
    *H01J 37/22*     (2006.01)
    *H01J 37/28*     (2006.01)
(52) U.S. Cl.
    CPC ............ *H01J 37/28* (2013.01); *H01J 37/222* (2013.01); *H01J 37/226* (2013.01)
(58) Field of Classification Search
    CPC .. H01J 37/00; H01J 37/02; H01J 37/26; H01J 37/28; H01J 37/222; H01J 37/226; H01J 37/228; H01J 2237/2809; H01J 2237/2817

USPC .......................................... 250/306, 307, 311
See application file for complete search history.

(56) References Cited

U.S. PATENT DOCUMENTS

2010/0085684 A1     4/2010  Suh et al.
2011/0036981 A1*    2/2011  Zhao ..................... H01J 37/226
                                                    250/306
2012/0235036 A1*    9/2012  Hatakeyama ........... H01J 37/20
                                                    250/310

(Continued)

FOREIGN PATENT DOCUMENTS

TW          201132968  A    10/2011
WO     WO 2020/053967 A1     3/2020

OTHER PUBLICATIONS

International Search Report (PCT/ISA/210) issued in PCT Application No. PCT/JP2020/036728 dated Dec. 8, 2020 with English translation (four (4) pages).

(Continued)

*Primary Examiner* — Jason L Mccormack
(74) *Attorney, Agent, or Firm* — Crowell & Moring LLP

(57) ABSTRACT

An object of the invention is to obtain an observation image in which a plurality of pieces of feature data of a sample are emphasized in a charged particle beam device that acquires an observation image of the sample by irradiating the sample with a charged particle beam and light. The charged particle beam device according to the invention calculates a sequence for modulating a light irradiation condition according to an irradiation condition of a charged particle beam, and controls the light irradiation condition according to the sequence (see FIG. 2).

14 Claims, 17 Drawing Sheets

(56) References Cited

U.S. PATENT DOCUMENTS

| | | | |
|---|---|---|---|
| 2016/0189923 A1* | 6/2016 | Juodkazis ............ | H01J 37/263 |
| | | | 250/492.1 |
| 2021/0066029 A1* | 3/2021 | Shouji .................. | H01J 37/228 |
| 2022/0059317 A1 | 2/2022 | Shouji et al. | |
| 2022/0139667 A1* | 5/2022 | Shouji .................. | H01J 37/226 |

OTHER PUBLICATIONS

Japanese-language Written Opinion (PCT/ISA/237) issued in PCT Application No. PCT/JP2020/036728 dated Dec. 8, 2020 (four (4) pages).

Chinese-language Office Action issued in Taiwanese Application No. 110130620 dated Apr. 14, 2022 (six (6) pages).

* cited by examiner

▨ AREA WITHOUT IMAGE INFORMATION

NOT INFLUENCED
BY CHARGING

INFLUENCED
BY CHARGING

DOT PATTERN

SiN (CONCAVE PORTION)   SiN (CONVEX PORTION)

(1)

SEM IMAGE IN RELATED ART

(2)

P-POLARIZED LIGHT:
S-POLARIZED LIGHT = 0:1

(3)

P-POLARIZED LIGHT:
S-POLARIZED LIGHT = 1:0

(4)

P-POLARIZED LIGHT:
S-POLARIZED LIGHT = 4:1

SCAN DIRECTION OF SEM (1)

(2)

(1)

CHARGED PARTICLE BEAM DEVICE

TECHNICAL FIELD

The present invention relates to a charged particle beam device for irradiating a sample with a charged particle beam.

BACKGROUND ART

In a manufacturing process of a semiconductor device, in-line inspection and measurement by using a scanning electron microscope (SEM) is an important inspection item for a purpose of improving a yield. However, since organic materials such as a resist and an antireflection film used in a lithography process have compositions close to one another, or silicon-based semiconductor materials constituting a transistor have compositions close to one another, it is difficult to obtain a difference in secondary electron emission from the materials. Since a sample made of such materials has a low SEM image contrast, visibility of an ultrafine pattern or a defect of the semiconductor device is reduced.

PTL 1 below describes a scanning electron microscope capable of obtaining an observation image having a contrast in which a material or an electric characteristic of a sample is emphasized by irradiating the sample with light.

CITATION LIST

Patent Literature

PTL 1: WO2020/053967

SUMMARY OF INVENTION

Technical Problem

An observation image in which a contrast is emphasized by irradiation with light has the contrast based on a light irradiation condition. An optimal condition for the light irradiation condition differs depending on feature data (for example, the material of the sample, a shape pattern formed on the sample, and an electrical connection relation of circuit patterns formed on the sample) of the sample emphasized on the observation image. Therefore, in the scanning electron microscope of the related art such as that disclosed in PTL 1, it is difficult to emphasize all desired feature data within a field of view (FOV).

The invention has been made in view of the above problem, and an object thereof is to obtain an observation image in which a plurality of pieces of feature data of a sample are emphasized in a charged particle beam device that acquires the observation image of the sample by irradiating the sample with a charged particle beam and light.

Solution to Problem

The charged particle beam device according to the invention calculates a sequence for modulating a light irradiation condition according to an irradiation condition of a charged particle beam, and controls the light irradiation condition according to the sequence.

Advantageous Effects of Invention

According to the charged particle beam device of the invention, in the charged particle beam device that acquires an observation image of a sample by irradiating the sample with a charged particle beam and light, it is possible to obtain an observation image in which a plurality of pieces of feature data of the sample are emphasized.

DESCRIPTION OF EMBODIMENTS

First Embodiment

Figure 1:
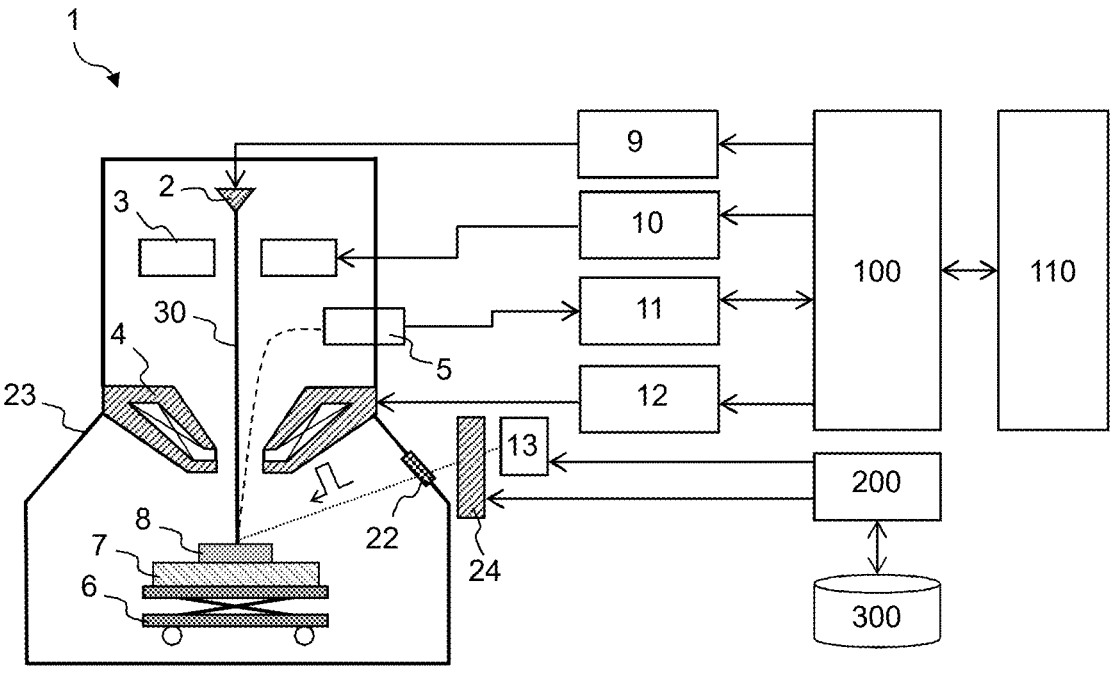
FIG. 1 is a configuration diagram of a charged particle beam device 1 according to a first embodiment.

FIG. 1 is a configuration diagram of a charged particle beam device 1 according to a first embodiment of the invention. The charged particle beam device 1 is configured as a scanning electron microscope that acquires an observation image of a sample 8 by irradiating the sample 8 with an electron beam 30 (primary charged particle). The charged particle beam device 1 includes an electron optical system, a stage mechanism system, an electron beam control system, a light irradiation system, a charged particle control unit 100, an image processing unit 110, a light control unit 200, and a storage unit 300.

The electron optical system includes an electron gun 2, a deflector 3, an electron lens 4, and a detector 5. The stage mechanism system includes an XYZ stage 6 and a sample holder 7. The electron beam control system includes an electron gun control unit 9, a deflection signal control unit 10, a detection control unit 11, and an electron lens control unit 12. The light irradiation system includes a light source 13 and a light irradiation unit 24.

The charged particle control unit 100 controls the scanning electron microscope via the electron gun control unit 9, the deflection signal control unit 10, the detection control unit 11, and the electron lens control unit 12. The image processing unit 110 generates an image of the sample 8 using a secondary charged particle signal detected by the detector 5. The light control unit 200 controls the light source 13 and the light irradiation unit 24 to control light irradiation condition with which the sample 8 is irradiated. The storage unit 300 stores data describing feature data of the sample 8.

The electron beam 30 accelerated by the electron gun 2 is focused by the electron lens 4, and the sample 8 is irradiated with the electron beam 30. The deflector 3 controls an irradiation position of the electron beam 30 on the sample 8. The detector 5 detects secondary charged particles emitted from the sample 8 by irradiating the sample 8 with the electron beam 30.

The light source 13 emits light with which the sample 8 is irradiated. The light source 13 is a laser capable of outputting a single wavelength or multiple wavelengths in a range of the output wavelengths from ultraviolet rays to near-infrared rays. With the light emitted from the light source 13, the sample 8 installed in a vacuum via a glass window 22 provided in a device housing 23 is irradiated. The light irradiation unit 24 modulates the light irradiation condition by modulating a light parameter representing a physical characteristic of light emitted by the light source 13 according to an instruction from the light control unit 200.

First Embodiment: Principle of Modulation of Optical Parameter

By irradiating the sample 8 with light and irradiating an irradiation area with the electron beam 30, it is possible to obtain an image whose contrast is changed according to a light absorption characteristic of the irradiation area. The light absorption characteristic of the irradiation area depends on, for example, the following feature data: (a) a material forming the irradiation area, (b) a three-dimensional shape pattern formed in the irradiation area, (c) an electrical connection relation of circuit patterns formed in the irradiation area, and the like. The term "electrical connection relation" used herein refers to a connection relation in an electric circuit, such as whether a circuit pattern is electrically connected to other circuit patterns formed in upper and lower layers.

Therefore, since an image acquired under a certain light irradiation condition has a contrast corresponding to an amount of secondary charged particles generated from a sample under the irradiation condition, feature data of the sample to be emphasized on the image is also unique to the irradiation condition. In other words, feature data with which an image contrast can be emphasized under one light irradiation condition is limited. Thus, it can be said that it is difficult to emphasize all feature data of the sample on one image.

Therefore, in the invention, by changing the light irradiation condition for each feature data of the sample, an image having a contrast in which the feature data is emphasized is generated. Accordingly, it is considered that a plurality of pieces of feature data of the sample can be emphasized on the observation image. An image in which the feature data is emphasized may be individually generated for each feature data, or all of the plurality of pieces of feature data may be emphasized in one image by generating the image while changing the light irradiation condition in one electron beam scan.

Figure 2:
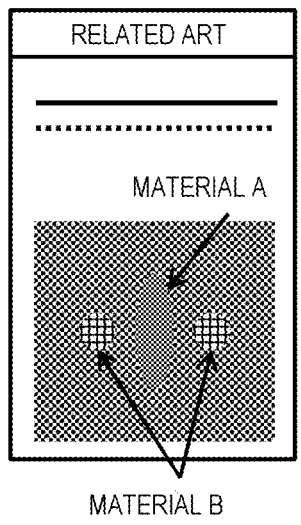
FIG. 2 is a schematic diagram showing an example of a light irradiation condition according to the first embodiment.
Figure 2:
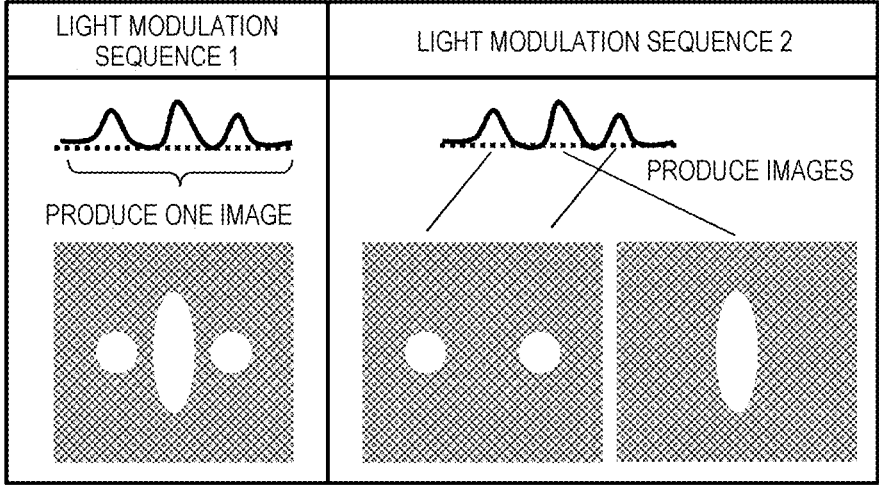

FIG. 2 is a schematic diagram showing an example of the light irradiation condition according to the first embodiment. For comparison, a light irradiation condition in the related art is also shown. Here, it is assumed that a shape pattern formed of two different materials (a material A and a material B) exists on the sample. In a technique for emphasizing an image contrast by light irradiation in the related art, the light irradiation conditions are constant regardless of a site of the sample. Therefore, in the image obtained in this way, the contrast is emphasized corresponding to light absorption characteristics of each material. An upper part of FIG. 2 schematically shows a contrast of a site formed by each material by using a filled pattern.

However, since the light irradiation condition in the related art is constant regardless of the site, the light irradiation condition is not necessarily optimized according to the light absorption characteristics of each material. In this case, the contrast of the obtained image may not necessarily be clear enough to clearly identify each material site. For example, in the example shown in FIG. 2, a site formed by the material B is slightly dark and may not be distinguished from other sites. Furthermore, a site formed by the material A may not be necessarily clearly distinguished from other sites.

A lower part of FIG. 2 shows an example of the light irradiation condition in the first embodiment. In a period during which a site of the material A is irradiated with the electron beam 30, the light irradiation condition is set such that the contrast on the image becomes the highest according to a light absorption characteristic of the material A. Similarly, in a period during which a site of the material B is irradiated with the electron beam 30, the light irradiation condition is set such that the contrast on the image becomes the highest according to a light absorption characteristic of the material B. Accordingly, it is possible to obtain an image in which the sites formed by the material A and the material B each have a high contrast.

In order to obtain one image, it is necessary to scan the electron beam 30 with the entire observation site (Field of View) on the sample. In one scanning period, an observation image of the site of the material A and an observation image of the site of the material B are obtained. The image processing unit 110 may synthesize these observation images into one image, or may individually generate an image in which only the site of the material A is emphasized and an image in which only the site of the material B is emphasized. When images are generated individually, the sites formed by materials can be individually identified. When one image is generated, it is possible to grasp the entire shape pattern in a panoramic view.

Light irradiation conditions adjusted to emphasize the image contrast include, for example, a wavelength, a time-average intensity, an irradiation amount, a polarization, and an irradiation angle. When a pulse light is emitted, the following light irradiation conditions can be further adjusted: a pulse width, a peak intensity, and interval time between pulses.

In FIG. 2, a material forming the sample is given as an example of the feature data of the sample, and other light irradiation conditions that can emphasize the feature data may be used. For example, the above (a) to (c) are examples of the feature data of the sample. In addition, feature data such as a specific composition, a film thickness, a film configuration, a dopant species, a dopant concentration, a dopant depth, a carrier mobility, a carrier lifetime, crystallinity, and a crystal defect of a material can be considered to be emphasized.

Figure 3:
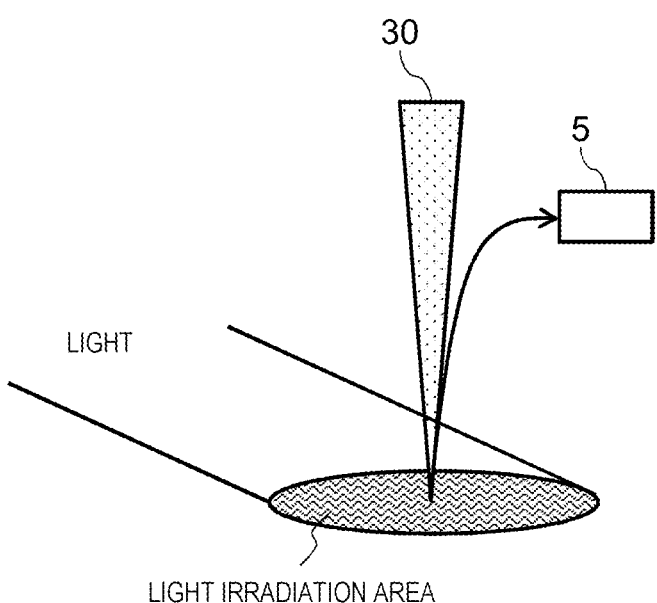
FIG. 3 is a schematic view of an observation site of a sample.

FIG. 3 is a schematic view of an observation site of the sample. The light irradiation unit 24 irradiates, with light, a surrounding area including a position irradiated with the electron beam 30. An irradiation position of the electron beam 30 can be specified according to a scanning sequence of the electron beam 30. The light irradiation unit 24 irradiates the irradiation position (and the surrounding area) with light. It is not necessary to irradiate other areas with light. By irradiating only the irradiation position of the electron beam 30 with light, the feature data at the irradiation position on the image can be effectively emphasized.

First Embodiment: Operation Procedure

Figure 4:
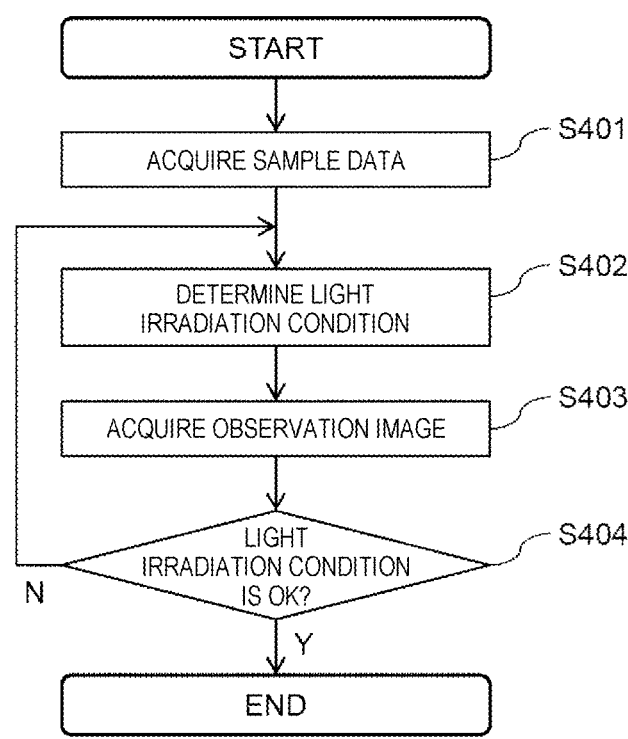
FIG. 4 is a flowchart illustrating a procedure for acquiring an observation image of a sample 8 by the charged particle beam device 1.

FIG. 4 is a flowchart illustrating a procedure for acquiring the observation image of the sample 8 by the charged particle beam device 1. This flowchart illustrates a process performed to acquire one observation image. Hereinafter, each step in FIG. 4 will be described.
(FIG. 4: Step S401)

The light control unit 200 acquires sample data describing the feature data of the sample 8. An example of the feature data is as described above. The sample data describes the feature data for each coordinate on a surface of the sample 8. For example, a material forming a site for each coordinate on the sample 8 can be described. Alternatively, coordinates representing a shape pattern formed on the sample 8 can be described. The sample data describes information that can specify the feature data of the sample 8 at least at the position which is irradiated with the electron beam 30, as well as other feature data.
(FIG. 4: Step S401: Supplement)

The sample data may be stored in the storage unit 300 in advance or may be input by the user via a user interface (for example, a graphical user interface (GUI)) in the charged particle beam device 1. Alternatively, the sample data may be provided from another device via a network. The sample data may be provided by other appropriate methods.
(FIG. 4: Step S402)

The light control unit 200 determines the light irradiation condition according to the feature data described in the sample data. Specifically, for each coordinate on the sample 8, the light irradiation condition at the coordinate is determined to obtain an image contrast in which desired feature data at the coordinate is emphasized. When the plurality of pieces of feature data are present in one coordinate, a light irradiation condition is selected such that any one or more pieces of the desired feature data can be emphasized. A case of returning from S404 to step 402 will be described later.
(FIG. 4: Step S402: Supplement 1)

6

A relation between the feature data of the sample 8 and the light irradiation condition under which the image contrast in which the feature data of the sample 8 is emphasized can be obtained, is defined in advance according to an experimental result or the like. For example, data describing the relation may be stored in advance in the storage unit 300, or an operation that defines the relation may be incorporated in advance in a software that defines an operation of the light control unit 200.
(FIG. 4: Step S402: Supplement 2)

A relation between the coordinates of the sample 8 and the light irradiation condition under which the image contrast in which the feature data at the coordinates is emphasized can be obtained, may be described in advance as light irradiation condition data and stored in the storage unit 300. In this case, in addition to or instead of the sample data acquired in S401, the light irradiation condition data is acquired in this step. In other words, the light control unit 200 only needs to be able to determine the light irradiation condition for each coordinate on the sample 8.
(FIG. 4: Step S403)

The charged particle control unit 100 irradiates the sample 8 with the electron beam 30 and scans the electron beam 30 in an observation area. The detector 5 detects secondary charged particles obtained from the observation area and outputs the secondary charged particles as a secondary charged particle signal to the image processing unit 110. The image processing unit 110 generates an image of the observation area using the secondary charged particle signal.
(FIG. 4: Step S404)

The light control unit 200 determines whether a contrast of the obtained observation image is sufficient. When the contrast is sufficient, the present flowchart is ended. When the contrast is not sufficient, the light irradiation condition may not be appropriate, and thus the process returns to S402 and the same process is performed using another light irradiation condition. Whether the contrast is sufficient can be determined by, for example, whether a luminance difference between an image area corresponding to the feature data and the other image areas is equal to or greater than a threshold. Whether the contrast is sufficient may be determined by other appropriate methods.
(FIG. 4: Step S404: Supplement)

When returning from S404 to S402, for example, a predetermined light irradiation condition may be changed at random and then the process returns to S402. Specifically, for example, a value having a certain width is defined in advance as the light irradiation condition to be used in S402. When S402 is performed for the first time, a center value within a range of the width may be used, and when S402 is performed for the second time or later, an unused value within the range of the width may be randomly used. The light irradiation condition may be changed by other appropriate methods. For example, the light irradiation condition under which an optimal image contrast can be obtained may be determined by a searching-based method.

Figure 5:
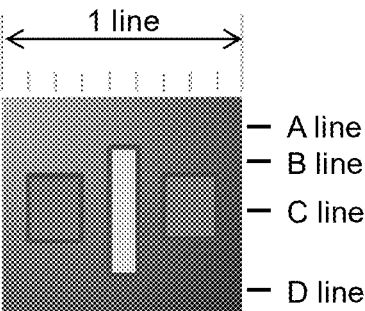
FIG. 5 is a diagram showing a specific example of a light irradiation sequence.
Figure 5:
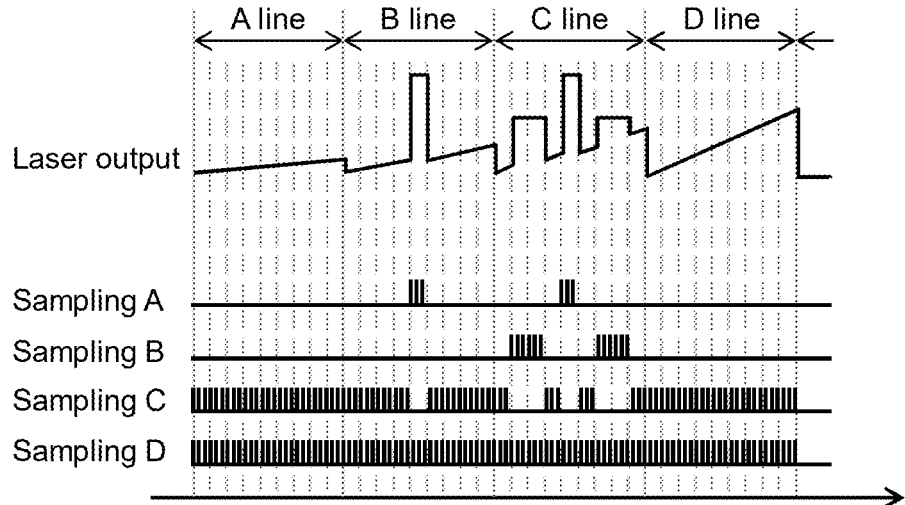
Figure 5:
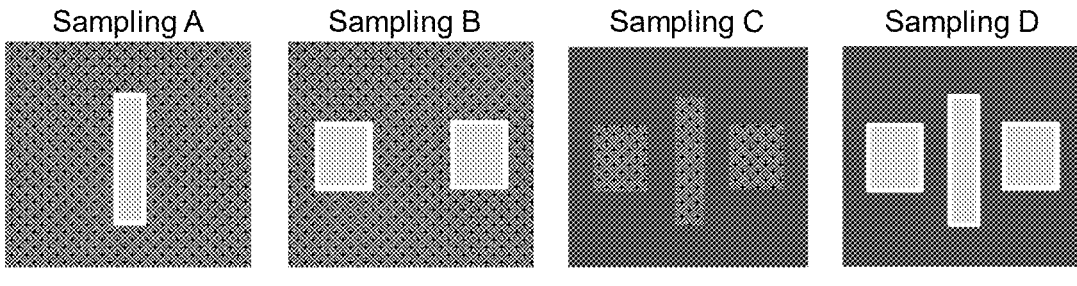

FIG. 5 is a diagram showing a specific example of a light irradiation sequence. It is assumed that a shape pattern shown in an upper part of FIG. 5 is formed on the sample. A light irradiation sequence when each of A to D lines is scanned is shown in the middle of FIG. 5. A portion with a highest laser power peak in the irradiation sequence represents a light irradiation condition for emphasizing a rectangle formed in a center. Portions of the irradiation sequence on both sides of the highest peak represent light irradiation conditions for emphasizing the rectangles formed on both sides.

When all the secondary particle signals obtained by the light irradiation sequence are sampled (a sampling D), an observation image in which all feature data is emphasized is obtained as indicated by the sampling D in a lower part of FIG. 5. When only a part of the secondary particle signals is sampled, an observation image in which only the sampled feature data is emphasized can be obtained. A sampling A is an example in which only a central rectangle is emphasized, and a sampling B is an example in which only rectangles on both sides thereof are emphasized. Alternatively, only the secondary particle signal obtained from a background portion where no shape pattern is formed may be emphasized. A sampling C corresponds to the secondary particle signal.

Instead of sampling the secondary particle signal, all the secondary particle signals may be acquired once, and any one of the secondary particle signals may be selectively used when the image processing unit 110 generates an observation image. Even in this case, it is possible to obtain an observation image in which each feature data is selectively emphasized as in the lower part of FIG. 5.

Figure 6A:
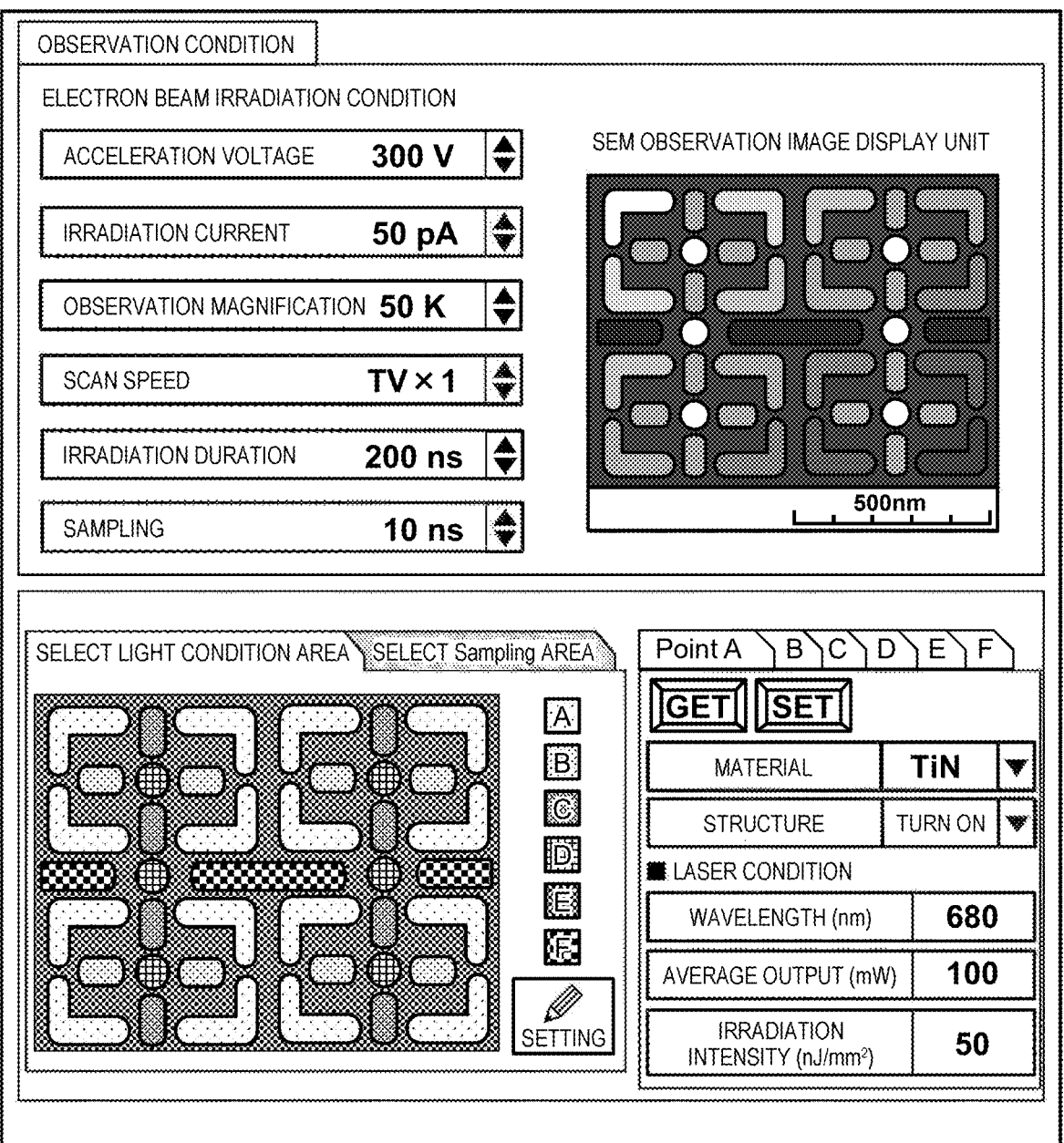
FIG. 6A is an example of a GUI used by a user to give an instruction input to the charged particle beam device 1.

FIG. 6A is an example of a graphical user interface (GUI) used by the user to give an instruction input to the charged particle beam device 1. The GUI can be provided by, for example, the light control unit 200 displaying a screen on a display device (for example, a display).

At a lower left part of the GUI, a shape pattern formed on the sample is displayed. Shape patterns of the same type (for example, patterns formed of the same material) are grouped in advance. The user selects a shape pattern on the GUI, and sets a light irradiation condition for the shape pattern in a lower right part of the screen. The light control unit 200 sets a light irradiation condition for each shape pattern on the sample according to the setting. Accordingly, it is possible to set, for each light irradiation position, a light irradiation condition for emphasizing the sample feature data formed at the position.

Information on a material, a shape pattern, a circuit pattern, and other feature data for each coordinate on the sample can be acquired, for example, by storing data describing these feature data for each coordinate on the sample (for example, data describing coordinates and a material of a shape pattern) in the storage unit 300 in advance and reading the data. Alternatively, the shape pattern can be specified by acquiring an observation image of the sample once and identifying the shape pattern on the observation image by image recognition. An upper right part of FIG. 6A is an example of the observation image.

Figure 6B:
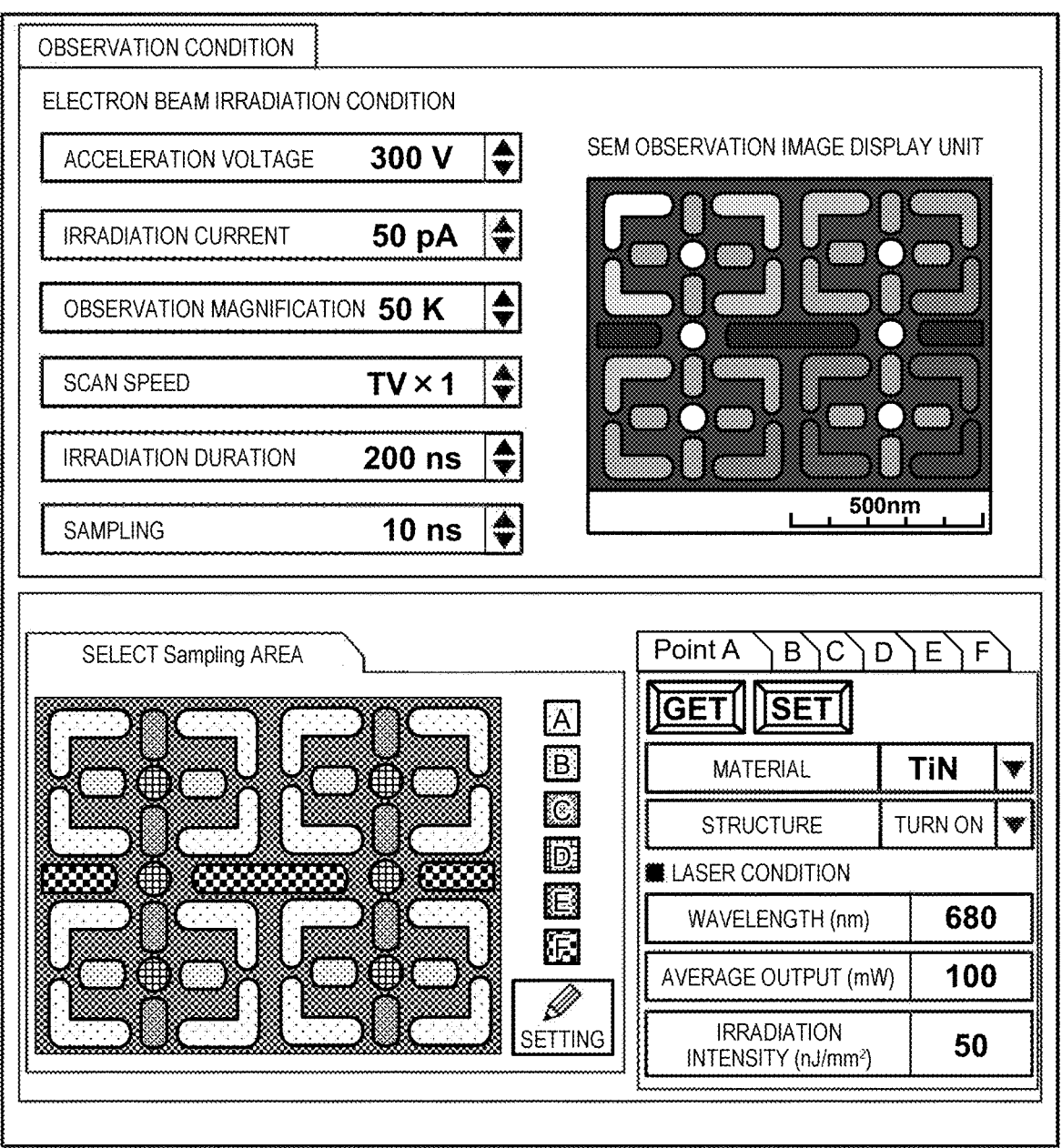
FIG. 6B is another example of the GUI used by the user to give an instruction input to the charged particle beam device 1.

FIG. 6B is another example of the GUI used by the user to give an instruction input to the charged particle beam device 1. The user specifies a shape pattern for generating an observation image at a lower left of the GUI. The image processing unit 110 generates the observation image of the sample using a secondary particle signal obtained from the specified shape pattern. Accordingly, for example, as shown in FIG. 5, it is possible to obtain an observation image in which only feature data of the shape pattern specified by the user is emphasized.

First Embodiment: Summary

The charged particle beam device 1 according to the first embodiment calculates a sequence for modulating a light irradiation condition of light with which a sample is irradiated according to an irradiation condition of a charged particle beam, and controls the light irradiation condition according to the sequence. Accordingly, it is possible to obtain an observation image in which the feature of the sample is emphasized according to the irradiation condition of the charged particle beam.

The charged particle beam device 1 according to the first embodiment calculates, for each feature data of the sample, a light irradiation sequence for causing the secondary charged particles in which the feature data of the sample is emphasized to be generated from the sample, and generates an observation image using the secondary charged particle signal acquired according to the light irradiation sequence. Accordingly, it is possible to obtain an observation image in which the feature data of the sample is individually emphasized. Therefore, even when the sample has a plurality of pieces of feature data, all of the plurality of pieces of feature data can be emphasized on the observation image.

The charged particle beam device 1 according to the first embodiment can also generate a plurality of observation images in which the feature data of the sample are individually emphasized (see a lower right part of FIG. 2). When the plurality of observation images in which the feature data are individually emphasized are generated, the feature data can be individually identified from the observation images. When one observation image is generated, it is possible to grasp the entire feature data in a panoramic view.

The charged particle beam device 1 according to the first embodiment reacquires an observation image by changing the light irradiation condition when a contrast for each feature data of the sample that appears on the observation image is not sufficient. Accordingly, the feature data of the sample can be reliably emphasized on the observation image.

Second Embodiment

In the first embodiment, an example has been described in which the light irradiation condition under which a contrast-emphasized image can be obtained for each feature data of the sample 8 is determined for each coordinate on the sample 8. In a second embodiment of the invention, as an example of a method for determining a light irradiation condition, an example in which an image luminance distribution is made uniform in an observation area will be described. A configuration of the charged particle beam device 1 is the same as that according to the first embodiment.

Figure 7:
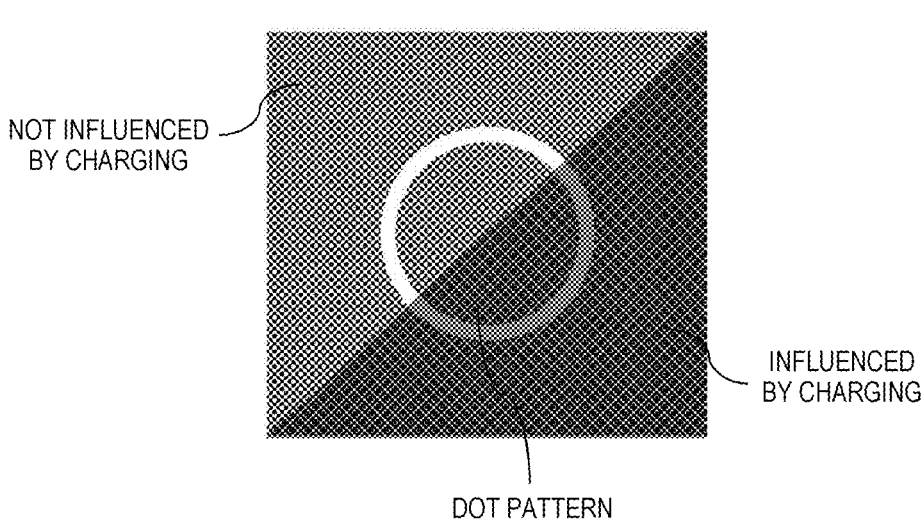
FIG. 7 is an example in which a luminance distribution of the observation image of the sample 8 is non-uniform.

FIG. 7 is an example in which a luminance distribution of the observation image of the sample 8 is non-uniform. A luminance value of the observation image varies due to various factors. For example, when the sample 8 is charged, an amount of secondary charged particles varies due to an influence of the charging, and the luminance value of the observation image varies due to the variation, and a luminance distribution of the image may be non-uniform even under the same observation condition. FIG. 7 shows an example in which, even when an irradiation condition of the electron beam 30 and a light irradiation condition are the same, the luminance distribution is different between a position influenced by the charging and the other positions. There are various factors that vary the luminance value of the observation image other than the charging of the sample 8.

In the second embodiment, when an observation image having a non-uniform luminance distribution as shown in FIG. 7 is obtained, the light control unit 200 adjusts the light irradiation condition such that the luminance distribution becomes uniform. For example, it is determined in S404 whether the luminance distribution is non-uniform, and when the light irradiation condition is changed in a process of returning from S404 to S402, the light irradiation condition may be changed such that the luminance distribution becomes uniform.

Figure 8:
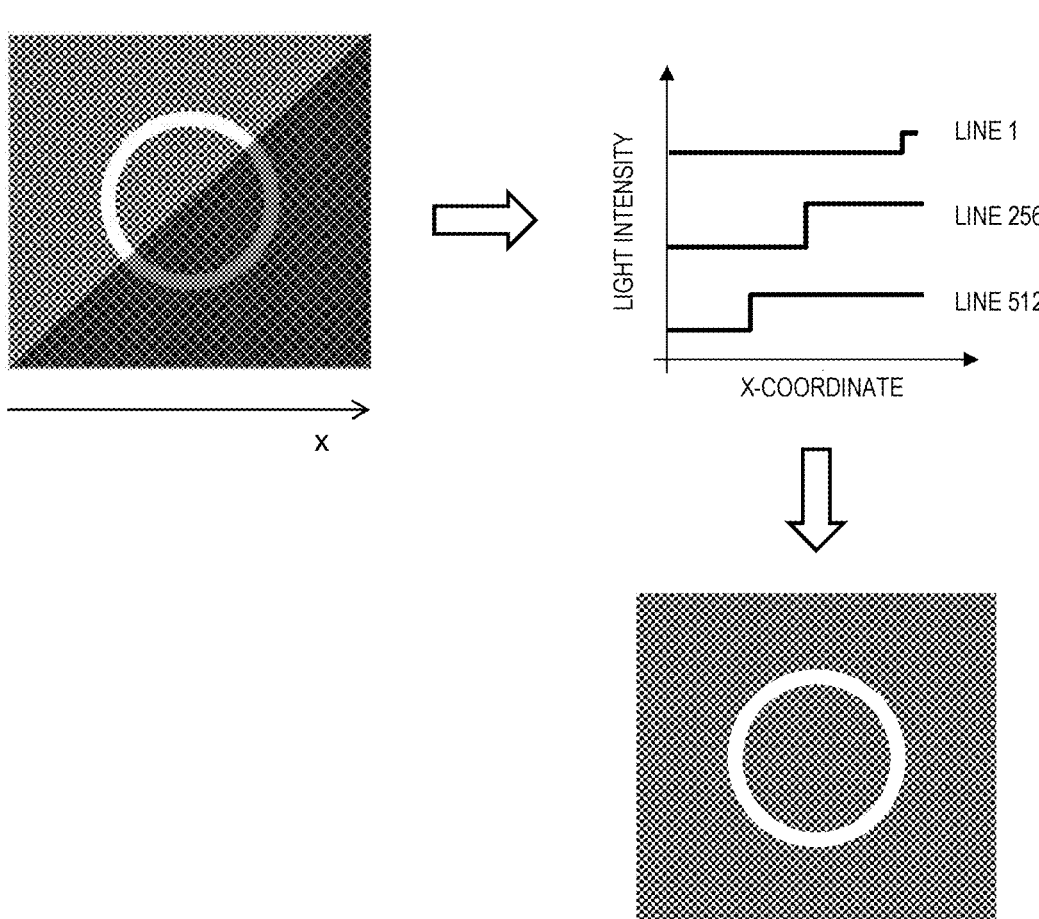
FIG. 8 shows an example of a procedure for changing a light irradiation condition by a light control unit 200.

FIG. 8 shows an example of a procedure for changing the light irradiation condition by a light control unit 200. Here, an example of adjusting a light irradiation condition for the image shown in FIG. 7 in which the luminance is non-uniform will be described. In the observation image shown in FIG. 7, it is not necessary to change the light irradiation condition for a site near an upper left end, and it is necessary to increase a light intensity in order to increase a luminance value for a site near a lower right end. Therefore, as shown in an upper right part of FIG. 8, the light control unit 200 performs correction so as to increase the light intensity for a wider x-coordinate range toward a lower side of the image. The observation image after the correction has a more uniform luminance distribution over the entire image as shown in a lower right part of FIG. 8.

The light control unit 200 does not need to strictly match the luminance distribution in the observation image. For example, luminance values of two positions that are supposed to have the same luminance value may be compared, and the light irradiation condition may be corrected such that a difference between the two luminance values is within a threshold. The light irradiation condition to be adjusted is not limited to the light intensity, and other light irradiation conditions may be corrected as long as the luminance distribution can be made uniform.

Since it is assumed that areas having the same feature data (for example, shape patterns formed of the same material) have the same luminance distribution, it is considered necessary to make the luminance distribution of the image area uniform. However, for that purpose, it is necessary to grasp in advance the areas on the sample that have the same feature data. For example, data describing the feature data for each coordinate on the sample is stored in the storage unit 300 in advance, and the light control unit 200 reads the data, thereby specifying the areas having the same feature data. The data may be the same as data used to set the light irradiation condition for each coordinate.

Second Embodiment: Summary

The charged particle beam device 1 according to the second embodiment acquires the luminance distribution of the observation image, and calculates the light irradiation sequence such that the luminance distribution between the image areas becomes uniform at a position where the same feature data of the sample is emphasized. Accordingly, it is possible to prevent the image areas in which the same feature data is emphasized from having different luminance distributions. Therefore, it is possible to prevent the same feature data from being erroneously recognized as different feature data due to a difference in luminance distribution.

Third Embodiment

In the second embodiment, it has been described that the luminance distribution of the observation image is acquired, and the light irradiation condition is adjusted such that the luminance distribution becomes uniform in the image areas corresponding to the same feature data. It is considered that whether the luminance distribution of the observation image is uniform can be determined from the secondary particle signal used to generate the observation image. Therefore, in a third embodiment of the invention, an operation example of adjusting the luminance distribution of the observation image based on the secondary particle signal will be described. A configuration of the charged particle beam device 1 is the same as that according to the first embodiment.

Figure 9:
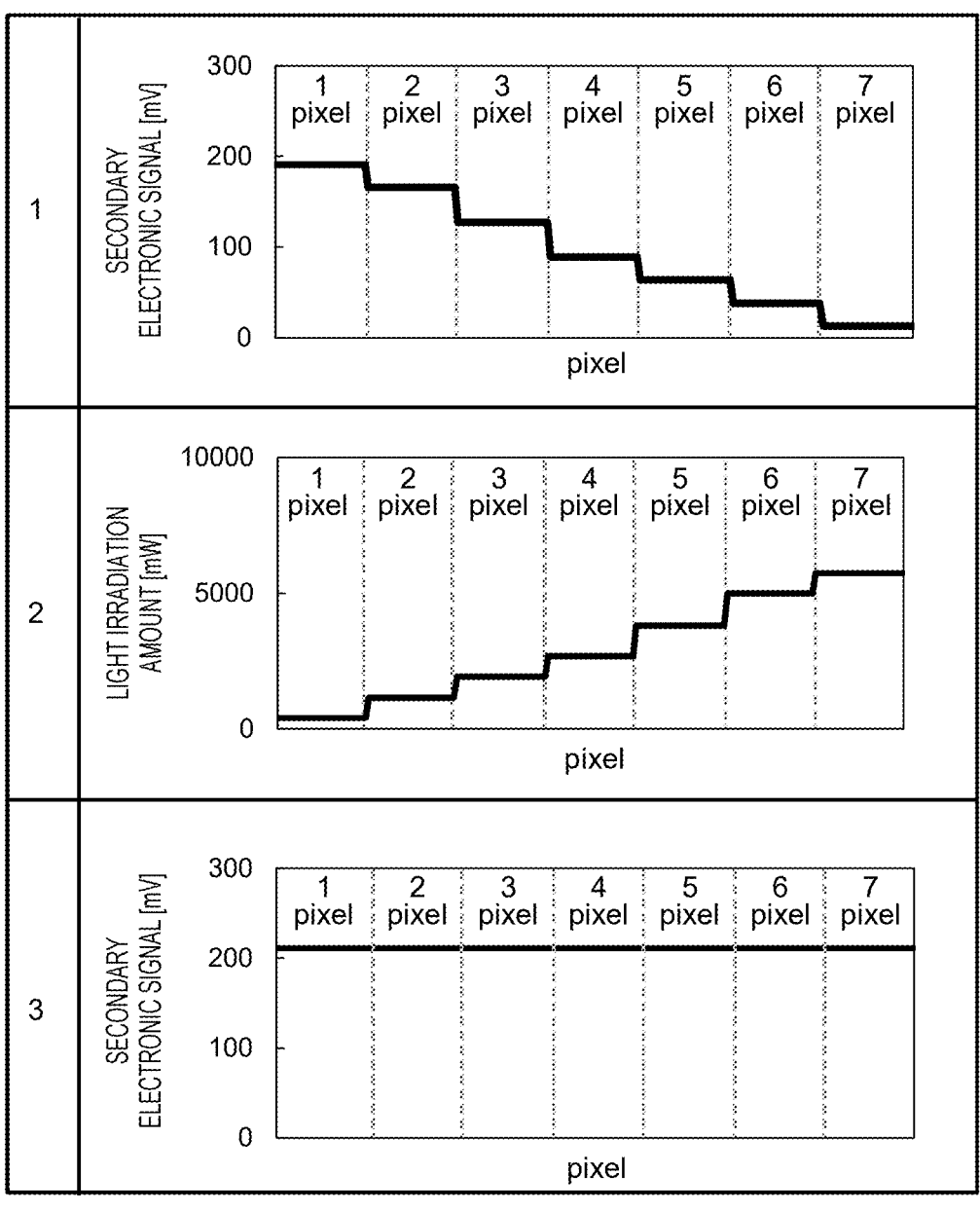
FIG. 9 is an example of a secondary particle signal and a light irradiation sequence.

FIG. 9 is an example of a secondary particle signal and a light irradiation sequence. Here, an example is shown in which scanning is performed with the electron beam 30 so as to cross areas (for example, areas formed of the same material) having the same feature data and formed on the sample. Intensities of secondary particle signals obtained from the areas having the same feature data should be equal for each pixel as shown in a pattern 3 of FIG. 9. However, due to various factors exemplified in the second embodiment, the luminance distribution may become non-uniform for each pixel as indicated by a pattern 1. Therefore, the light control unit 200 adjusts the light irradiation condition for each pixel such that an equivalent secondary particle signal can be obtained from the areas having the same feature data.

In the pattern 1 of FIG. 9, since an amount of the secondary particle signal decreases as a pixel position advances, the light control unit 200 increases a light irradiation intensity according to a decrease amount. Therefore, the light irradiation intensity at each pixel position increases as the pixel position advances, as shown in a pattern 2 of FIG. 9.

In FIG. 9, an example is shown in which a light irradiation amount is gradually increased, but the invention is not limited thereto, and the light irradiation amount can be adjusted for each pixel position according to the non-uniformity of the secondary particle signal. For example, the light irradiation condition may be set such that an equivalent secondary particle signal amount can also be obtained from the other pixels with reference to a pixel having a largest secondary particle signal amount among the pixels in the areas having the same feature data.

Figure 10:
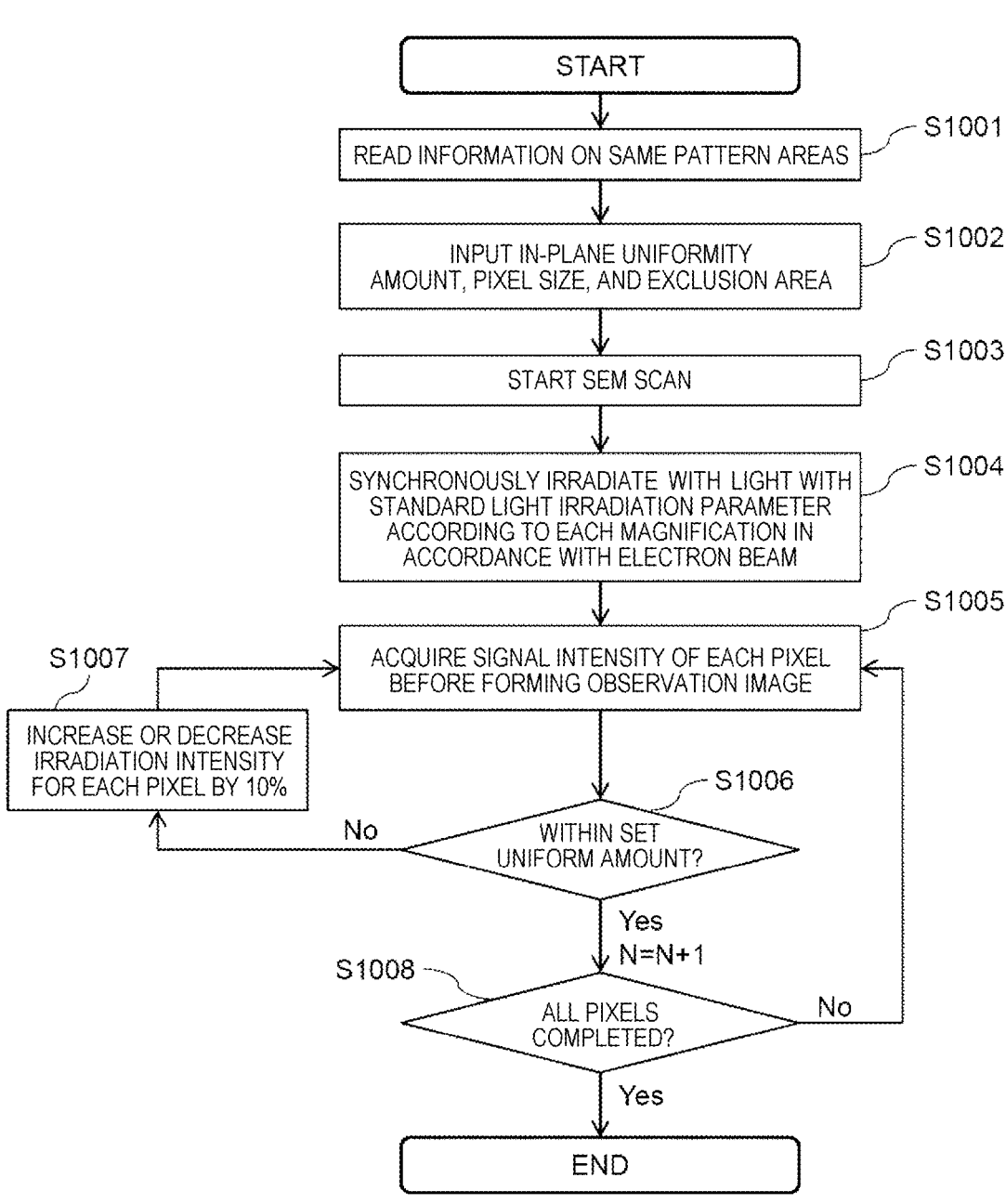
FIG. 10 is a flowchart illustrating a process for uniforming luminance distributions of image areas having the same feature data by the charged particle beam device 1.

FIG. 10 is a flowchart illustrating a process for uniforming luminance distributions of image areas having the same feature data by the charged particle beam device 1. Here, similar to FIG. 9, an operation example is shown in which scanning is performed by the electron beam 30 so as to traverse the areas having the same feature data and formed on the sample. Hereinafter, each step in FIG. 10 will be described.

(FIG. 10: Step S1001)

The light control unit 200 acquires information on the areas having the same feature data and formed on the sample. For example, the information can be acquired by reading out, from the storage unit 300, the data describing the feature data for each coordinate on the sample, or the information can also be acquired by once generating an observation image of the sample and identifying the same shape on the observation image (for example, it is assumed that the same shape pattern has the same feature data).

(FIG. 10: Step S1002)

The user inputs, via a GUI to be described later, information including: (a) a value specifying to what degree a luminance distribution in an area is made uniform (in-plane uniformity amount); (b) a pixel size of an area in which the luminance distribution is made uniform; and (c) coordinates of an area to be excluded from uniformity of the luminance distribution (exclusion area).

(FIG. 10: Step S1003)

The charged particle control unit 100 starts scan of the electron beam 30.

(FIG. 10: Step S1004)

The light control unit 200 irradiates the sample with light using a standard light irradiation parameter. The standard light irradiation parameter is defined in advance for each feature data such that the feature data of the sample can be emphasized on the observation image. The standard light irradiation parameter may be changed according to an observation magnification.

(FIG. 10: Step S1005)

The light control unit 200 acquires a secondary particle signal intensity at a pixel position where the image processing unit 110 has not yet formed an observation image. In the present embodiment, an object is to make the luminance distribution uniform based on the secondary particle signal intensity without using the luminance distribution on the observation image. Step S1005 is for determining the luminance distribution without forming an observation image according to the object.

(FIG. 10: Step S1006)

The light control unit 200 determines whether the secondary particle signal acquired in step S1005 falls within a range of a uniform amount set in step S1002. For example, the light control unit 200 may determine whether a difference between the secondary particle signals at each pixel position is within the range of the uniform amount. When the difference is out of the range, the process proceeds to step S1007. When the difference is within the range, a pixel position counter N is incremented by one and the process proceeds to step S1008.

(FIG. 10: Step S1007)

The light control unit 200 adjusts the light irradiation intensity at a pixel position where the secondary particle signal intensity is out of the uniform range. For example, the light irradiation intensity is increased by 10% at a pixel position where the secondary particle signal intensity is lower than the uniform range, and the light irradiation intensity is decreased by 10% at a pixel position where the secondary particle signal intensity is higher than the uniform range. After step S1007, the process returns to step S1005 and the same process is repeated.

(FIG. 10: Step S1008)

When the above processes have been completed for all pixel positions, the present flowchart ends. If not completed, the process returns to step S1005 and the same process is repeated.

Figure 11:
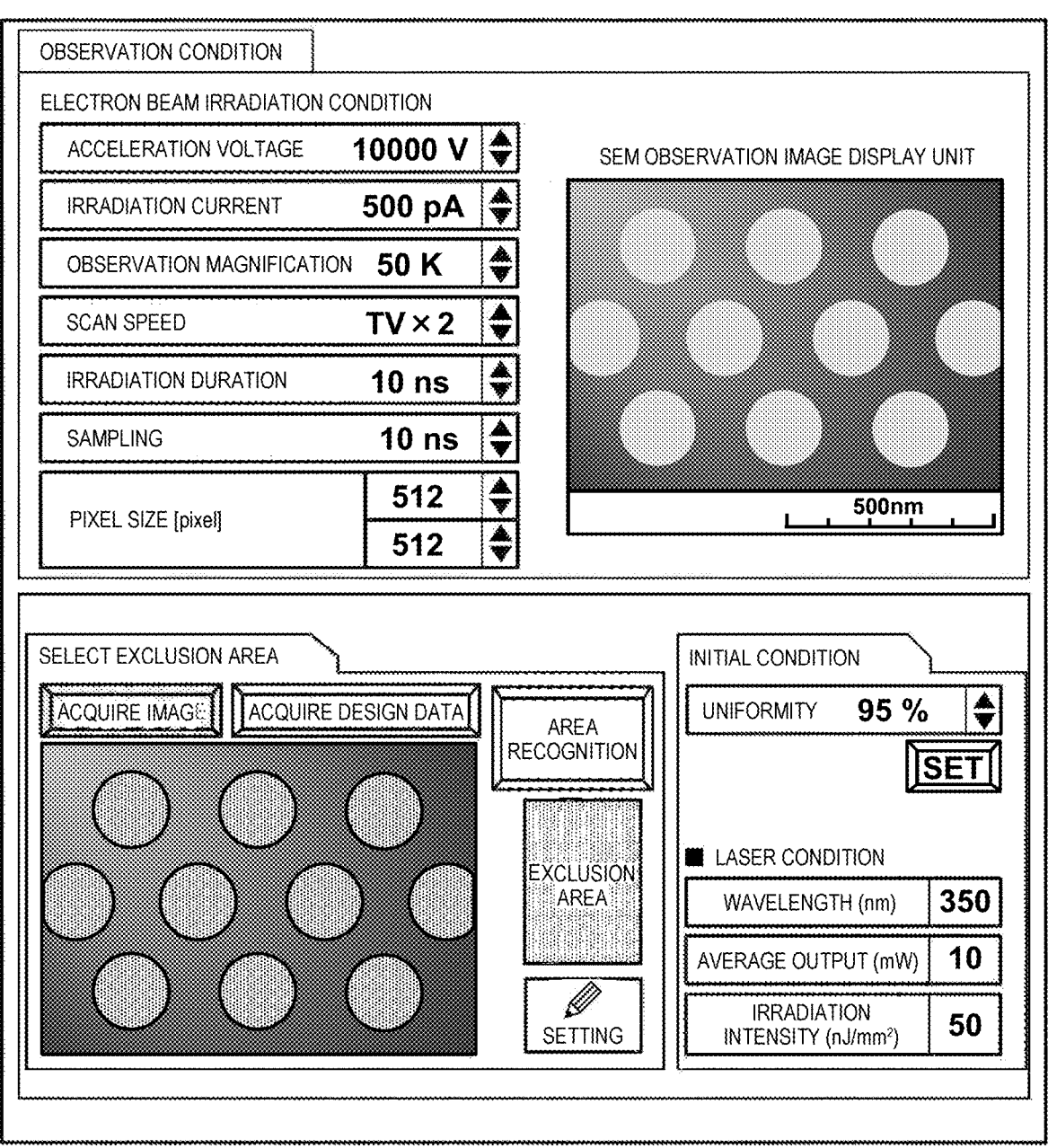
FIG. 11 is an example of a GUI used by a user in step S1002.

FIG. 11 is an example of the GUI used by the user in step S1002. The in-plane uniformity amount can be input from the "uniformity" at the lower right part of the screen. A pixel size of an area where the luminance distribution is made uniform can be input from the "pixel size" in an upper part of the screen. A non-target area of the equalization can be specified by specifying the exclusion area on the lower left of the screen. The coordinates of the shape pattern formed on the sample may be acquired in the same manner as in the first embodiment. A GUI similar to that of FIG. 11 can also be used in the second embodiment.

Third Embodiment: Summary

The charged particle beam device 1 according to the third embodiment calculates the light irradiation sequence such that the secondary particle signal intensity is uniform in the areas having the same feature data on the sample. Accordingly, the same effects as those according to the second embodiment can be exhibited before the observation image is generated.

Fourth Embodiment

Figure 12A:
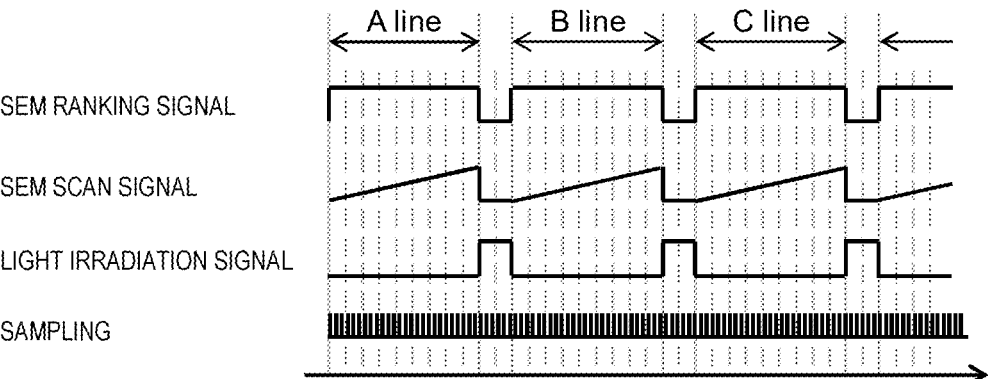
FIG. 12A is an example of a timing chart illustrating a timing of irradiating a sample with light.

FIG. 12A is an example of a timing chart illustrating a timing of irradiating a sample with light. In FIG. 12A, the sample is irradiated with light in a period during which the sample is not irradiated with the electron beam 30 (for example, a gap period between a period during which the A line is scanned and a period during which the B line is scanned). By acquiring the observation image at this timing, portions other than an area having feature data can be emphasized on an observation image.

Figure 12B:
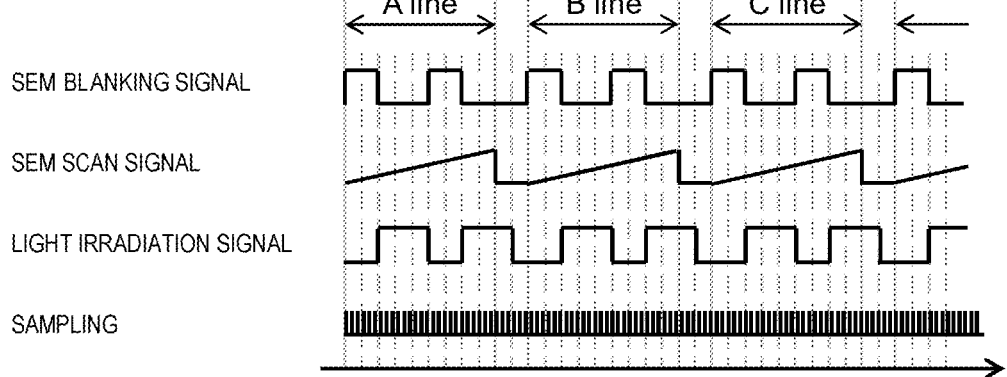
FIG. 12B is another example of a timing chart illustrating a timing of irradiating the sample with light.

FIG. 12B is another example of the timing chart illustrating the timing of irradiating the sample with light. The image processing unit 110 may generate an observation image in a period during which the sample is not irradiated with light separately from observation images generated in other periods. For example, a secondary particle signal generated in a period during which the sample is not irradiated with light is sampled, or only the secondary particle signal generated in the period is used to generate an observation image. Accordingly, as in FIG. 12A, portions other than the area having the feature data can be emphasized on the observation image.

Fifth Embodiment

In the present embodiment, a charged particle beam device having a contrast control method that controls, by polarization plane control, an irradiation amount to a sample which changes according to information on a structure to be irradiated, and uses a structure of the same material which is difficult to be identified by controlling the secondary electron emission amount by electron beam condition control in the related art is described. A configuration diagram of the charged particle beam device 1 according to the fifth embodiment is the same as that according to the first embodiment.

Figure 13:
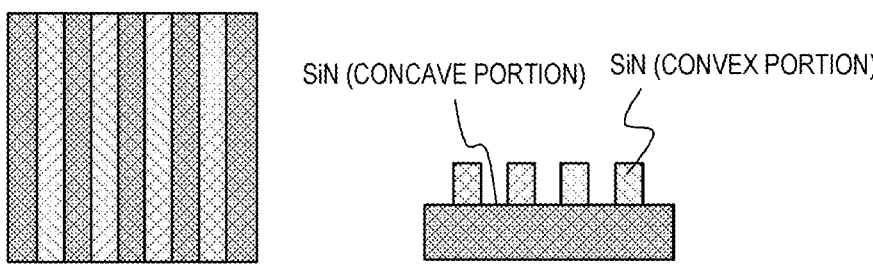
FIG. 13 shows a sample used in a fifth embodiment.

FIG. 13 shows a sample used in the present embodiment. In the present embodiment, a sample formed of a silicon nitride (SiN) film in a line shape is used. Since line portions and substrate portions are formed of the same SiN, it is difficult to emphasize and change a contrast under an irradiation condition of a primary electron beam. Therefore, by using coherence between the light and the structure, a contrast at each coordinate is emphasized by a change in light irradiation amount according to a shape. Since the light has a difference in an amount of reflection or an amount of absorption (irradiation amount) depending on a height and a width of the structure, it is possible to obtain an optimal contrast in each coordinate by controlling the light irradiation amount in accordance with a shape of each coordinate. Specifically, a polarization plane of light to be irradiated is controlled according to information on surrounding shape located at each coordinate.

A light absorption coefficient correlates with an increment in a secondary electron emission amount. Therefore, a contrast forming method that measures the secondary electron emission amount by controlling the irradiation amount by controlling the polarization plane and utilizes a difference in structure, which is difficult with electron beams alone, will be described below.

Figure 14:
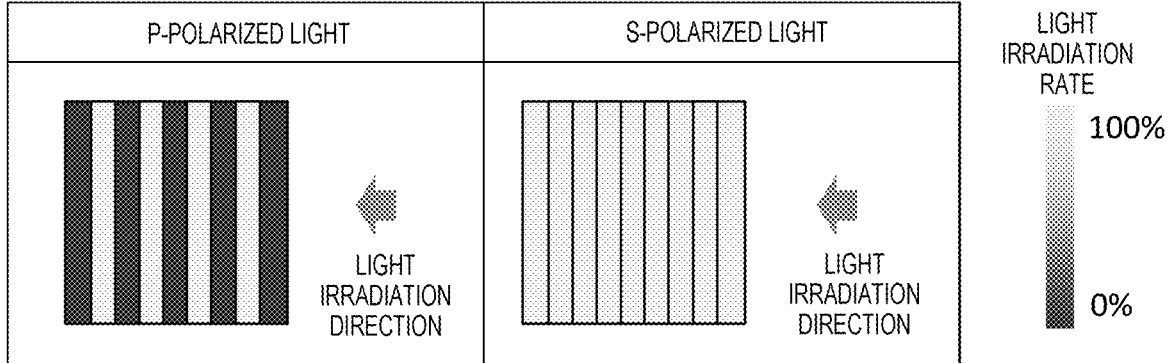
FIG. 14 shows a relation between light absorption rates in the sample shown in FIG. 13 when polarization planes are irradiated.

FIG. 14 shows a relation between light absorption rates in the sample shown in FIG. 13 when polarization planes are irradiated. The light irradiation amount correlates with the secondary electron emission amount, and the secondary electron emission amount increases as the light irradiation amount increases. Therefore, the larger the light irradiation amount, the larger the secondary electron emission amount. When a polarization plane P was irradiated, a light absorption rate was 90% because the light was emitted to a convex portion, whereas a light absorption rate was 10% because the light was reflected by a structure of a concave portion. When a polarization plane S is irradiated, the convex portion is irradiated with 80% of the light, and the concave portion is irradiated with 80% of the light because the light is diffracted and applied. Using this characteristic, the polarization plane of the light is adjusted, controlled, and irradiated in accordance with an irradiation position for contrast control formation that does not depend on the structure. FIG. 14 can also be displayed on the GUI.

Figure 15:
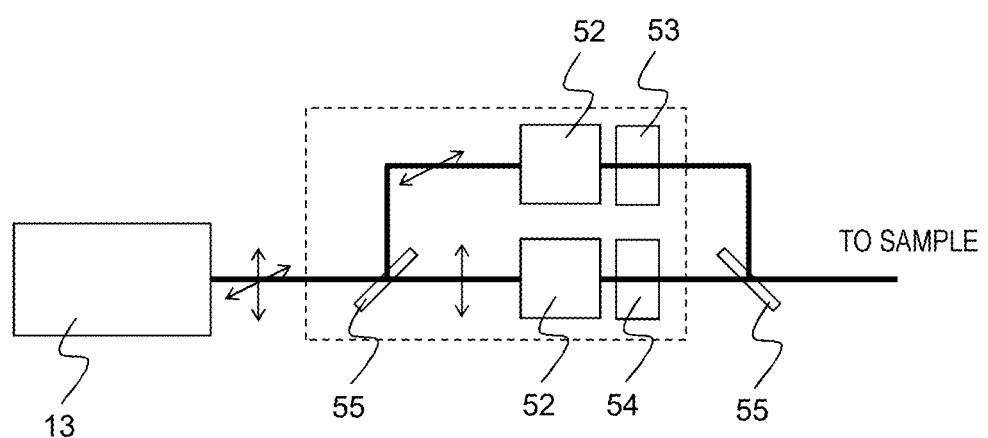
FIG. 15 shows an example of an optical system that controls and irradiates a polarization plane of light in synchronization with a scanning signal of a SEM.

FIG. 15 shows an example of an optical system that controls and irradiates a polarization plane of light in synchronization with a scanning signal of an SEM. A laser beam emitted from the light source 13 is split by a beam splitter 55, one optical path is polarized by a P polarizing plate 53 into P-polarized light, and the other optical path is polarized by an S polarizing plate 54 into S-polarized light. An electric modulation element 52 controls a polarization plane of the laser to be irradiated in synchronization with the scanning signal of the SEM in accordance with a position to be scanned. The electric modulation element 52 can be implemented by an acousto-optic modulator, an electro-optical modulator, or the like.

Figure 16:
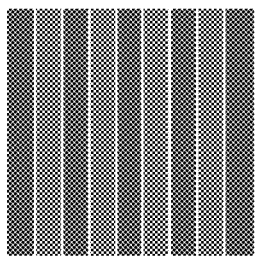
FIG. 16 shows SEM images when the polarization planes of light to be irradiated are controlled in accordance with a pattern using the sample in FIG. 13.
Figure 16:
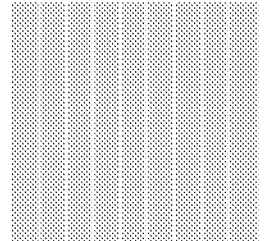
Figure 16:
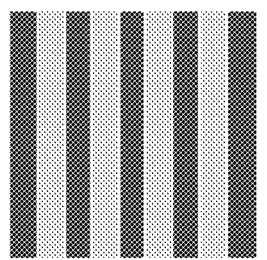
Figure 16:
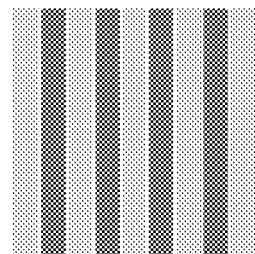

FIG. 16 shows SEM images when the polarization planes of light to be irradiated are controlled in accordance with a pattern using the sample in FIG. 13. (1) of FIG. 16 is an SEM image obtained without light irradiation. (2) of FIG. 16 shows an SEM image obtained when the same amount of the P-polarized light is emitted to the convex portion and the same amount of the S-polarized light is emitted to the concave portion. (3) of FIG. 16 shows an SEM image obtained when the concave and convex portions are irradiated with P-polarized light. When the concave portion is irradiated with the P-polarized light, since the light irradiation rate with respect to the concave portion is low, the secondary electron emission amount is small, and contrasts of the concave and convex portions increase. Therefore, on the SEM image, a contrast of the convex portion>a contrast of the concave portion. (4) of FIG. 16 shows an SEM image obtained when irradiating the concave and convex portions while controlling irradiation amounts of the P-polarized light and the S-polarized light such that the contrast of the convex portion<the contrast of the concave portion.

Figure 17:
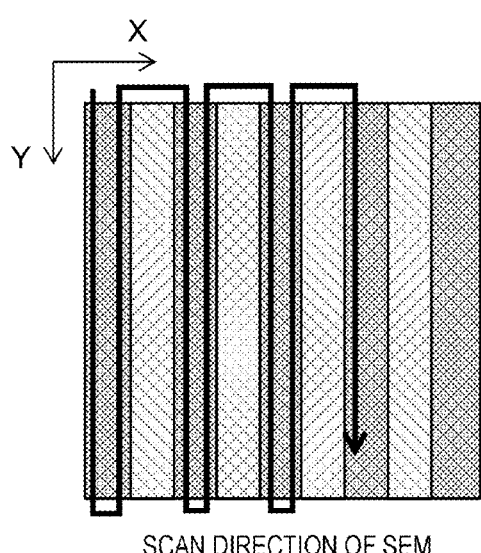
FIG. 17 shows a time sequence of the SEM and light irradiation conditions when a SEM image in (4) of FIG. 16 is acquired.
Figure 17:
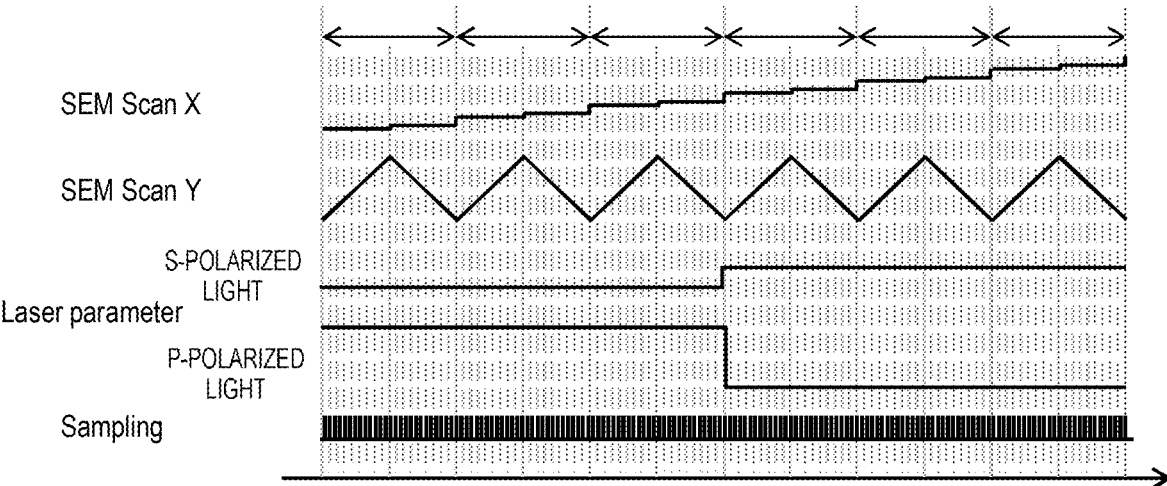

FIG. 17 shows a time sequence of SEM and light irradiation conditions when the SEM image in (4) of FIG. 16 is acquired. An upper diagram of FIG. 17 shows a scan direction of the SEM. A lower diagram of FIG. 17 shows scan sequences of this SEM and irradiation sequences of light. As shown in this scan sequence, it is possible to control the light irradiation conditions in accordance with the scan sequences of the SEM that performs various operations.

Figure 18:
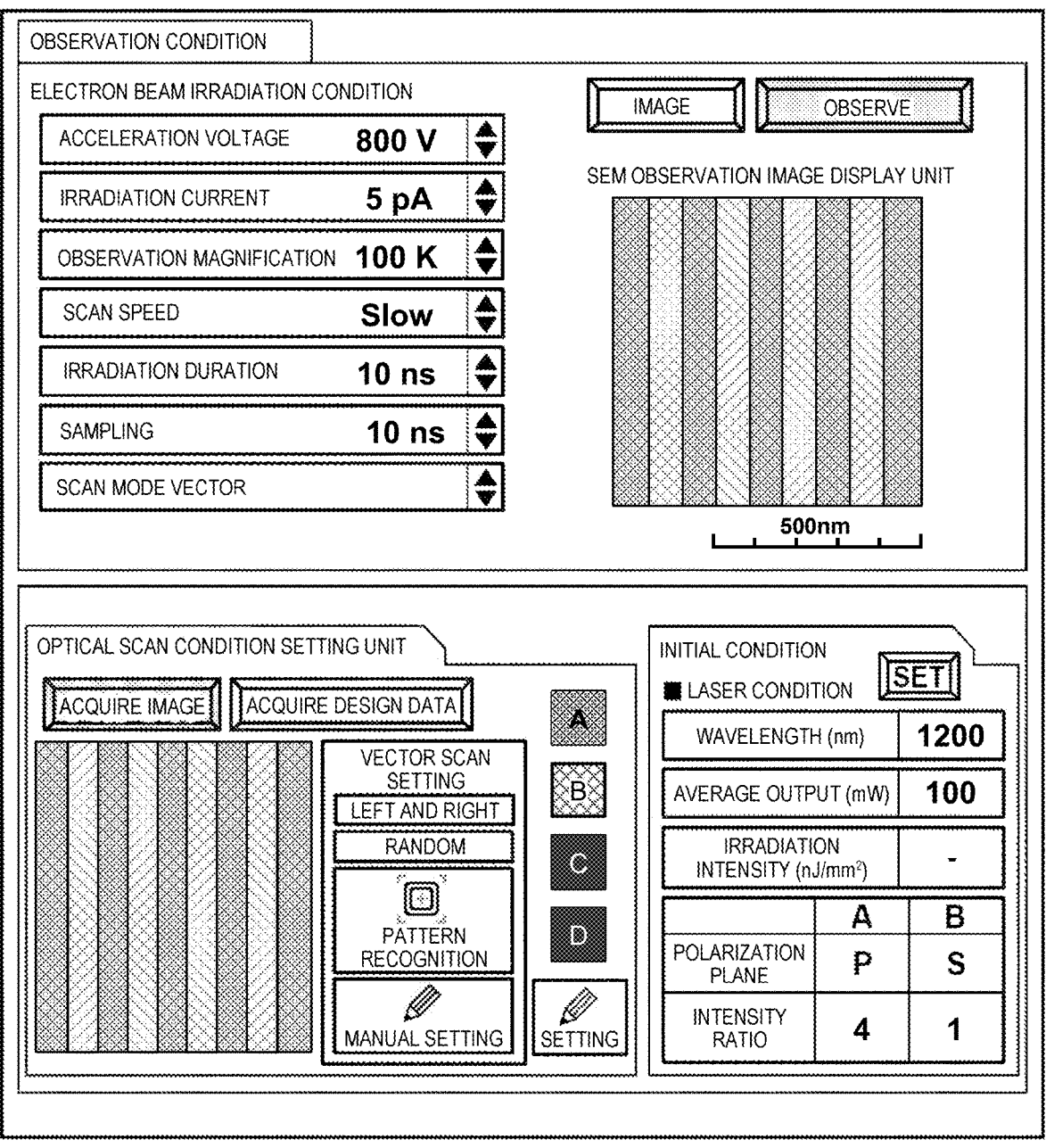
FIG. 18 shows an example of a GUI provided by the charged particle beam device 1 in the fifth embodiment.

FIG. 18 shows an example of a GUI provided by the charged particle beam device 1 in the fifth embodiment. On an upper left side, an electron beam irradiation condition setting unit that sets an electron beam irradiation condition is displayed. On an upper right side, an SEM image is displayed. An "image" button allows to capture an image. When an "observe" button is active, an SEM image is displayed in real time on an SEM observation image display unit. An optical scan condition setting unit is provided on a lower left side, and when "vector" is selected as a scan mode of the electron beam irradiation condition on an upper left side, the scan direction is set in a "vector scan setting" unit. The vector scan setting includes a "left and right" mode in which scanning is performed while the scan direction of the SEM is changed between left and right, a "random" mode in which scanning is performed at random, a "pattern recognition" mode in which scanning is performed for each pattern, and a "manual setting" mode in which the user determines the scan direction and the scan sequence. A method for setting a light irradiation condition in accordance with each pattern is the same as that of the GUI shown in the first embodiment. At a lower left part of the GUI, a shape pattern formed on the sample is displayed. Shape patterns of the same type (for example, patterns formed of the same material) are grouped in advance. The user selects a shape pattern on the GUI, and sets a light irradiation condition for the shape pattern in a lower right part of the screen. The light control unit 200 sets a light irradiation condition for each shape pattern on the sample according to the setting. Accordingly, it is possible to set, for each light irradiation position, a light irradiation condition for emphasizing the sample feature data formed at the position. The light irradiation condition can be set at a lower right part of FIG. 18, and the light irradiation condition can be set for each light irradiation condition distinguished by each shape pattern. In the present embodiment, the polarization plane and an intensity ratio can be set according to each area (A and B in FIG. 18).

Information on a material, a shape pattern, a circuit pattern, and other feature data for each coordinate on the sample can be acquired, for example, by storing data describing these feature data for each coordinate on the sample (for example, data describing coordinates and a material of a shape pattern) in the storage unit 300 in advance and reading the data. Alternatively, the shape pattern can be specified by acquiring an observation image of the sample once and identifying the shape pattern on the observation image by image recognition.

According to the present embodiment, the secondary electron emission amount that changes according to the shape of each coordinate is controlled by the polarization plane, and information reflecting the shape contrast of the same material, which is difficult to be identified by controlling the secondary electron emission amount by acceleration voltage control, can be acquired.

<Method for Modulating Light Irradiation Condition in Accordance with Feature Data>

Figure 19:
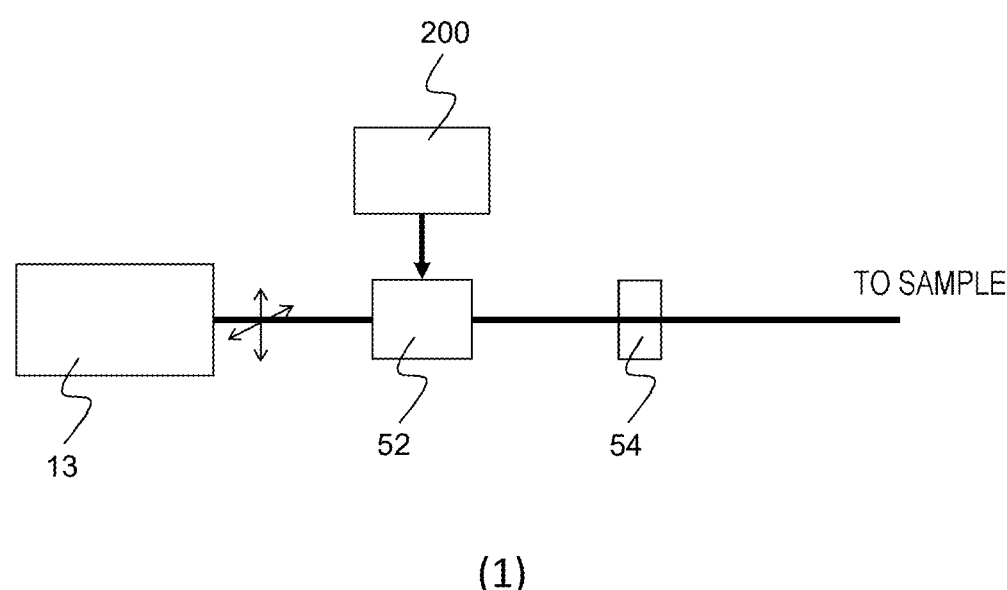
FIG. 19 shows examples of an optical configuration for controlling an average intensity and an irradiation amount of light, which are light irradiation conditions.
Figure 19:
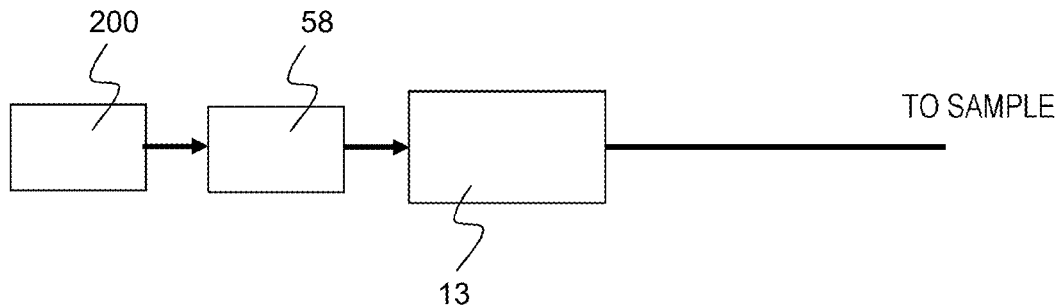
Figure 20:
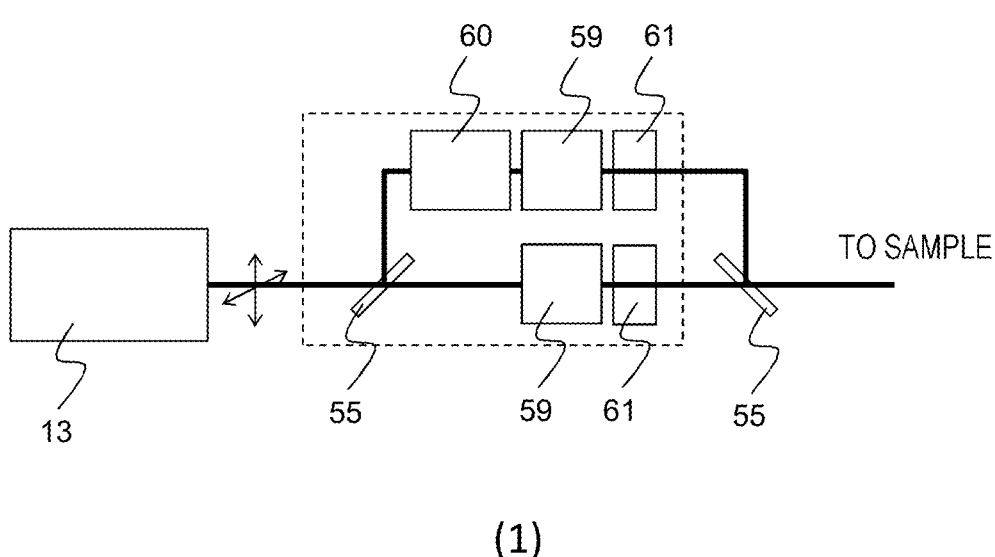
FIG. 20 shows examples of an optical configuration for controlling a wavelength of light, which is a light irradiation condition.
Figure 20:
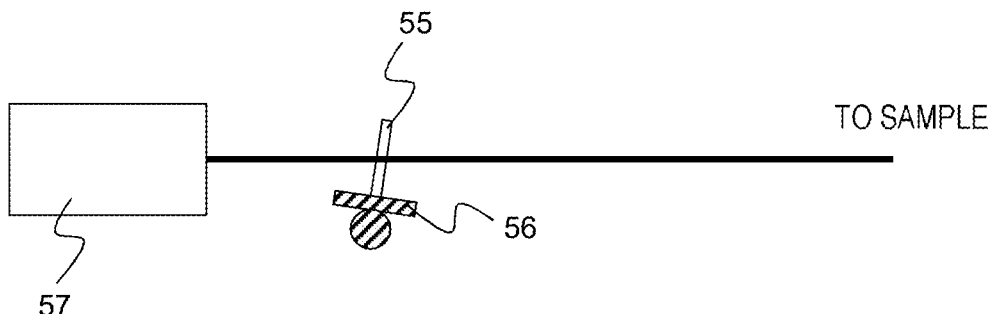

FIGS. 19 and 20 illustrate an example of an optical configuration in which a light irradiation parameter is modulated in accordance with the feature data of the sample. This optical configuration can be used in each of the above embodiments.

FIG. 19 shows examples of an optical configuration for controlling an average intensity and an irradiation amount of light, which are light irradiation conditions. As shown in (1) of FIG. 19, an electro-optical effect element is used to perform intensity modulation in accordance with the feature data of the sample. The electro-optical effect element is an optical element that modulates a transmittance by changing a polarization plane of a crystal by applying a voltage to LBO (lithium triborate) or the like. Therefore, in order to perform irradiation with a light intensity in accordance with the feature data of the sample, it is possible to input a light control signal calculated by the light control unit 200 to the electro-optical element and modulate the light irradiation amount and the light intensity in accordance with each pixel. (2) of FIG. 19 shows an example in which a semiconductor laser is used as the light source 13. In the semiconductor laser, since the light irradiation amount changes according to input current, an intensity modulation condition corresponding to each coordinate is input from the light control unit 200 to the semiconductor laser control unit 58, so that an input current amount to the semiconductor laser is controlled and the light irradiation amount to the sample is controlled. The intensity modulation of the light may be controlled by using an acousto-optical element or a magneto-optical element.

FIG. 20 shows examples of an optical configuration in which a wavelength of light, which is a light irradiation condition, is controlled. (1) of FIG. 20 shows an optical configuration in which an irradiation timing of each wavelength is controlled using an acousto-optical element 59. The light emitted from the light source 13 is split by the beam splitter 55, and the light in one direction passes through the acousto-optical element 59 and a polarizer 61. In the optical configuration, an optical path in the other direction passes through a second harmonic generator 60 for modulating the wavelength, is modulated to a wavelength different from an original wavelength, passes through the acousto-optical element 59 and the polarizer 61, and merges with the other optical path by the beam splitter 55. At this time, the acousto-optical element 59 installed in an optical path of each wavelength controls an irradiation timing of a laser of each wavelength in accordance with the feature data of the sample, and performs irradiation. (2) of FIG. 20 shows an optical configuration in which a white light source 57 and an etalon filter are used as light sources, and the irradiation of light is controlled in accordance with the feature data of the sample. The etalon filter is an optical element having a characteristic that a wavelength of transmitted light changes depending on an incidence light angle to the filter. In the invention, the white light source 57 is used as the light source, and an incident angle of the etalon filter with respect to the light is controlled by a mechanical stage 56, thereby controlling a wavelength of the irradiation light to the sample. Angle control of the etalon filter is controlled such that a wavelength calculated by the light control unit 200 is output. The white light source 57 may be a halogen lamp or a super container light source, and any light source capable of emitting light of various wavelengths, such as a xenon lamp, may be used.

Although not shown, there is also a method for controlling and irradiating a wavelength with which a sample is irradiated in accordance with feature data of the sample by installing a plurality of lasers having different wavelengths on one optical configuration, and operating an electro-optical element or an acousto-optical element in accordance with the feature data of the sample.

<Modification of Invention>

The invention is not limited to the above embodiments, and includes various modifications. For example, the above embodiments are described in detail for easy understanding of the invention, and the invention is not necessarily limited to those including all the configurations described above. Further, a part of a configuration according to one embodiment can be replaced with a configuration according to another embodiment, and the configuration according to another embodiment can be added to the configuration according to one embodiment. A part of the configuration of each embodiment can be added, deleted, or replaced with other configurations.

In the above embodiments, the charged particle control unit 100, the image processing unit 110, and the light control unit 200 may be implemented by hardware such as a circuit device on which functions of the charged particle control unit 100, the image processing unit 110, and the light control unit 200 are implemented, or may be implemented by an arithmetic apparatus such as a central processing unit (CPU) executing software having the functions.

In the above embodiments, although the scanning electron microscope has been described as an example of the charged particle beam device 1, the invention can also be applied to other charged particle beam devices. That is, the invention can be applied to a charged particle beam device that assists generation of secondary charged particles by irradiating a sample with light.

REFERENCE SIGNS LIST 1 charged particle beam device
2 electron gun
3 deflector
4 electron lens
5 detector
13 light source
52 electric modulation element
53 P polarizing plate
54 S polarizing plate
55 beam splitter
56 mechanical stage
57 white light source
58 semiconductor laser control unit
59 acousto-optical element
60 second harmonic generator
61 polarizer
62 etalon filter
100 charged particle control unit
110 image processing unit
200 light control unit
300 storage unit

The invention claimed is:

1. A charged particle beam device for irradiating a sample with a charged particle beam, the charged particle beam device comprising:

a charged particle source configured to irradiate the sample with the charged particle beam;

a light source configured to emit light with which the sample is irradiated;

a detector configured to detect secondary charged particles generated from the sample by irradiating the sample with the charged particle beam;

an image processing unit configured to generate an observation image of the sample based on a secondary charged particle signal obtained from the detector;

a charged particle control unit configured to control an irradiation condition of the charged particle beam; and a light control unit configured to control a light irradiation condition, wherein the light control unit calculates a sequence for modulating the light irradiation condition according to an irradiation condition of the charged particle beam, the light control unit controls the light irradiation condition according to the sequence, the light control unit calculates, for each feature data of the sample, the sequence for causing the secondary charged particles in which the feature data of the sample is emphasized to be generated from the sample, and the image processing unit generates the observation image in which the feature data of the sample is emphasized by generating the observation image using a detection result of the secondary charged particles generated from the sample according to the sequence calculated for each feature data of the sample by the light control unit.

2. The charged particle beam device according to claim 1, wherein the light control unit acquires, as the feature data of the sample, at least one of a shape pattern formed on the sample, a material of the sample, and an electrical connection relation of circuit patterns formed on the sample, and the light control unit calculates the sequence for causing the secondary charged particles in which at least one of the shape pattern formed on the sample, the material of the sample, and the electrical connection relation of the circuit patterns formed on the sample is emphasized to be generated from the sample.

3. The charged particle beam device according to claim 1, wherein the detector detects the secondary charged particles in which first feature data of the sample is emphasized and the secondary charged particles in which second feature data of the sample is emphasized in a scanning period during which scanning is performed with the charged particle beam until the secondary charged particles necessary for generating the observation image in one area on the sample are obtained, and the image processing unit generates a first image in which the first feature data is emphasized and a second image in which the second feature data is emphasized using the secondary charged particle signal obtained in the scanning period.

4. The charged particle beam device according to claim 1, wherein the light control unit determines whether a contrast for each feature data on the observation image is equal to or greater than a threshold, the light control unit changes the light irradiation condition when the contrast is not equal to or greater than the threshold, and the image processing unit reacquires the observation image according to the changed light irradiation condition.

5. The charged particle beam device according to claim 1, further comprising:

a storage unit configured to store data describing a relation between coordinates on the sample and the light irradiation condition at the coordinates, wherein the light control unit calculates the sequence such that the light irradiation condition corresponding to the coordinates on the sample is obtained according to the relation described in the data.

6. The charged particle beam device according to claim 1, further comprising:

an interface configured to receive an instruction input from a user, wherein the interface is configured to specify, by the instruction input, the light irradiation condition for each area on the sample, and the light control unit controls the light irradiation condition for each area on the sample in accordance with the specification from the instruction input.

7. The charged particle beam device according to claim 3, further comprising:

an interface configured to receive an instruction input from a user, wherein the interface is configured to specify, by the instruction input, a first area to be irradiated with the light using a first light irradiation condition for emphasizing the first feature data and a second area to be irradiated with the light using a second light irradiation condition for emphasizing the second feature data on the sample, and the light control unit irradiates the first area with the light using the first light irradiation condition and irradiates the second area with the light using the second light irradiation condition in accordance with the specification from the instruction input.

8. The charged particle beam device according to claim 3, further comprising:

an interface configured to receive an instruction input from a user, wherein the interface is configured to specify, by the instruction input, an area for acquiring the observation image on the sample, and the image processing unit generates the observation image in which only the feature data in an area specified by the instruction input is emphasized by generating the observation image using secondary charged particles acquired from the area specified by the instruction input among the secondary charged particles.

9. The charged particle beam device according to claim 1, wherein the light control unit acquires a luminance distribution on the observation image, and the light control unit calculates the sequence such that a luminance difference between areas on the observation image in which the same feature data is emphasized is within a threshold.

10. The charged particle beam device according to claim 9, wherein the light control unit calculates the sequence such that with the light having a light amount larger than that of the other area on the observation image, a low luminance area having a luminance value lower than that of the other area among areas on the observation image in which the same feature data is emphasized is irradiated.

11. The charged particle beam device according to claim 9, further comprising:

a storage unit configured to store data describing a relation between coordinates on the sample and feature data of the sample at the coordinates, wherein the light control unit specifies an area having the same feature data on the sample according to the relation described in the data, and calculates the sequence such that the luminance difference on the observation image in the area is within the threshold.

12. The charged particle beam device according to claim 1, wherein the light control unit acquires a signal intensity of the secondary charged particles for each area on the sample, and the light control unit calculates the sequence such that a difference in the signal intensity between the areas having the same feature data on the sample is within a threshold, thereby causing, to be within the threshold, a luminance difference between the areas on the observation image in which the same feature data is emphasized.

13. The charged particle beam device according to claim 1, wherein the light control unit irradiates the sample with the light at a timing when the sample is not irradiated with the charged particle beam, or the image processing unit generates, at a timing when the sample is not irradiated with the light, the observation image using a detection result of the secondary charged particles generated from the sample.

14. The charged particle beam device according to claim 1, wherein the light control unit acquires, as the feature data of the sample, at least one of a composition, a film thickness, a film configuration, a dopant species, a dopant concentration, a dopant depth, a carrier mobility, a carrier lifetime, crystallinity, and a crystal defect of a material of the sample, and the light control unit calculates the sequence for causing the secondary charged particles in which at least one of 5 the composition, the film thickness, the film configuration, the dopant species, the dopant concentration, the dopant depth, the carrier mobility, the carrier lifetime, the crystallinity, and the crystal defect of the material of the sample is emphasized to be generated from the 10 sample.

\* \* \* \* \*